(12) United States Patent
Dutta

(10) Patent No.: US 12,388,682 B2
(45) Date of Patent: Aug. 12, 2025

(54) SYSTEMS AND METHODS FOR IMPROVING COMMON MODE TRANSIENT IMMUNITY IN SILICON DIGITAL ISOLATORS USING CAPACITIVE BARRIER FOR GALVANIC ISOLATION

(71) Applicant: Kinetic Technologies International Holdings LP, Toronto (CA)

(72) Inventor: Siddharth Dutta, San Jose, CA (US)

(73) Assignee: Kinetic Technologies International Holdings LP, Toronto (CA)

( * ) Notice: Subject to any disclaimer, the term of this patent is extended or adjusted under 35 U.S.C. 154(b) by 98 days.

(21) Appl. No.: 17/875,219

(22) Filed: Jul. 27, 2022

(65) Prior Publication Data
US 2024/0039769 A1 Feb. 1, 2024

(51) Int. Cl.
*H03F 3/45* (2006.01)
*H04B 1/04* (2006.01)
(Continued)

(52) U.S. Cl.
CPC ..... *H04L 25/0266* (2013.01); *H03F 3/45071* (2013.01); *H04B 1/04* (2013.01); *H04B 1/16* (2013.01)

(58) Field of Classification Search
CPC ..... H03F 1/02; H03F 1/26; H03F 1/32; H03F 3/45; H03F 3/195; H03F 3/45071;
(Continued)

(56) References Cited

U.S. PATENT DOCUMENTS 8,502,584 B1 8/2013 Dong et al.
2009/0058529 A1 3/2009 Meninger
(Continued)

FOREIGN PATENT DOCUMENTS

WO 2021/232861 A1 11/2021

OTHER PUBLICATIONS

PCT International Search Report and the Written Opinion mailed Nov. 13, 2023, issued in related International Application No. PCT/US2023/028750 (11 pages).
(Continued)

*Primary Examiner* — Shawkat M Ali
(74) *Attorney, Agent, or Firm* — Sheppard Mullin Richter & Hampton LLP

(57) ABSTRACT

Systems and methods are disclosed for improving common mode transient immunity in silicon digital isolators using capacitive barrier for galvanic isolation. The systems include transmitters and receivers that include differential amplifiers. The differential amplifier may include a first transistor electrically coupled between a first input of the transmitter and a first output of the transmitter, a second transistor electrically coupled between a second input of the transmitter and a second output of the transmitter, a first passive load electrically coupled between the first output of the transmitter and a source rail, and a second passive load electrically coupled between the second output of the transmitter and the source rail, wherein the first and second passive loads have the same impedance; and a bias voltage source configured to bias a gate of the first transistor and a gate of the second transistor.

20 Claims, 8 Drawing Sheets

(51) Int. Cl.
*H04B 1/16* (2006.01)
*H04L 25/02* (2006.01)

(58) Field of Classification Search
CPC .. H03K 3/00; H03K 3/01; H03K 5/02; H03K 19/0185; H04B 1/04; H04B 1/16; H04B 1/38; H04L 25/0266; H04L 27/00
USPC ........ 327/108, 158, 206, 407, 534; 330/258, 330/261; 375/219, 220, 286, 295, 316
See application file for complete search history.

(56) References Cited

U.S. PATENT DOCUMENTS

| | | |
|---|---|---|
| 2009/0140778 A1 | 6/2009 | Kikuchi et al. |
| 2010/0066450 A1 | 3/2010 | Palmer et al. |
| 2012/0161841 A1* | 6/2012 | Dong ................... H03K 3/3565 327/205 |
| 2013/0057350 A1 | 3/2013 | Riekki et al. |
| 2015/0326185 A1 | 11/2015 | Mikhemar et al. |
| 2020/0007089 A1 | 1/2020 | Ahmed et al. |
| 2021/0119590 A1* | 4/2021 | Du ......................... H03F 3/245 |
| 2023/0188097 A1 | 6/2023 | Chen et al. |

OTHER PUBLICATIONS

Office Action and Search Report dated Jul. 29, 2024, issued in related Taiwan Application No. 112128092, with English machine translation (16 pages).

* cited by examiner

SYSTEMS AND METHODS FOR IMPROVING COMMON MODE TRANSIENT IMMUNITY IN SILICON DIGITAL ISOLATORS USING CAPACITIVE BARRIER FOR GALVANIC ISOLATION

DESCRIPTION OF RELATED ART

The disclosed technology relates generally to electronic circuits, and more particularly some embodiments relate to silicon digital isolators.

SUMMARY

In general, one aspect disclosed features a transmitter, comprising: a differential amplifier having differential outputs connected to outputs of the transmitter, the differential amplifier comprising: a first transistor electrically coupled between a first input of the transmitter and a first output of the transmitter, a second transistor electrically coupled between a second input of the transmitter and a second output of the transmitter, a first passive load electrically coupled between the first output of the transmitter and a source rail, and a second passive load electrically coupled between the second output of the transmitter and the source rail, wherein the source rail is a source voltage rail or a source ground rail, and wherein the first and second passive loads have the same impedance; and a bias voltage source configured to bias a gate of the first transistor and a gate of the second transistor, wherein a voltage of the bias voltage source is a fixed predetermined voltage below a voltage of the source voltage rail or above a voltage of the source ground rail.

Embodiments of the transmitter may include one or more of the following features. In some embodiments, the first and second transistors are NMOS transistors. In some embodiments, the gate of the first transistor is electrically coupled to the first input of the transmitter; the gate of the second transistor is electrically coupled to the second input of the transmitter; the source rail is the source voltage rail; the first passive load is electrically coupled between a drain of the first transistor and the source voltage rail; the second passive load is electrically coupled between a drain of the second transistor and the source voltage rail; and a source of the first transistor is electrically coupled to a source of the second transistor. Some embodiments comprise a current source electrically coupled between the source ground rail and the sources of the first and second transistors. Some embodiments comprise a first bias resistor electrically coupled between the gate of the first transistor and the bias voltage source; and a second bias resistor electrically coupled between the gate of the second transistor and the bias voltage source. In some embodiments, a source of the first transistor is electrically coupled to a first input of the transmitter; a source of the second transistor is electrically coupled to a second input of the transmitter; the source rail is the source voltage rail; the first passive load is electrically coupled between a drain of the first transistor and the source voltage rail; the second passive load is electrically coupled between a drain of the second transistor and the source voltage rail; and the gate of the first transistor is electrically coupled to the gate of the second transistor. Some embodiments comprise a first current source electrically coupled between the source ground rail and the source of the first transistor; and a second current source electrically coupled between the source ground rail and the source of the second transistor. In some embodiments, the first and second passive loads comprise at least one of: a resistor; an inductor and a resistor electrically coupled in series, and a capacitor electrically coupled in parallel with the inductor and the resistor; an inductor and a resistor electrically coupled in series, and a capacitor electrically coupled in parallel with the inductor; or an inductor, a resistor, and a capacitor, wherein the inductor, the resistor, and the capacitor are electrically coupled in parallel.

In some embodiments, the first and second transistors are PMOS transistors. In some embodiments, the gate of the first transistor is electrically coupled to a first input of the transmitter; the gate of the second transistor is electrically coupled to a second input of the transmitter; the source rail is the source ground rail; the first passive load is electrically coupled between a drain of the first transistor and the source ground rail; the second passive load is electrically coupled between a drain of the second transistor and the source ground rail; and the source of the first transistor is electrically coupled to the source of the second transistor. In some embodiments, a current source electrically coupled between the source voltage rail and the sources of the first and second transistors. In some embodiments, a source of the first transistor is electrically coupled to a first input of the transmitter; a source of the second transistor is electrically coupled to a second input of the transmitter; the source rail is the source ground rail; the first passive load is electrically coupled between a drain of the first transistor and the source ground rail; the second passive load is electrically coupled between a drain of the second transistor and the source ground rail; and the gate of the first transistor is electrically coupled to the gate of the second transistor. Some embodiments comprise a first current source electrically coupled between the source voltage rail and the source of the first transistor; and a second current source electrically coupled between the source voltage rail and the source of the second transistor.

In general, one aspect disclosed features a receiver, comprising: a differential amplifier having differential inputs connected to inputs of the receiver, the differential amplifier comprising: a first transistor electrically coupled between a first input of the receiver and a first output of the receiver, a second transistor electrically coupled between a second input of the receiver and a second output of the receiver, wherein a source of the first transistor is electrically coupled to a source of the second transistor, a first passive load electrically coupled to the first input of the receiver, and a second passive load electrically coupled to the second input of the receiver, wherein the first and second passive loads have the same impedance; and a bias voltage source electrically coupled to the first and second passive loads, wherein a voltage of the bias voltage source is a fixed predetermined voltage below a voltage of a source voltage rail or above a voltage of a source ground rail, wherein the first passive load is electrically coupled between the first input of the receiver and the bias voltage source, and wherein the second passive load is electrically coupled between the second input of the receiver and the bias voltage source.

Embodiments of the receiver may include one or more of the following features. Some embodiments comprise a current source electrically coupled between the source rail and the first and second passive loads. In some embodiments, the first and second transistors are NMOS transistors. In some embodiments, the first and second transistors are PMOS transistors.

In general, one aspect disclosed features a receiver, comprising: a differential amplifier having differential inputs connected to inputs of the receiver, the differential amplifier comprising: a first transistor electrically coupled between a first input of the receiver and a first output of the receiver, a second transistor electrically coupled between a second input of the receiver and a second output of the receiver, wherein a gate of the first transistor is electrically coupled to a gate of the second transistor, a first passive load electrically coupled between the first input of the receiver and a source rail, and a second passive load electrically coupled between the first second of the receiver and the source rail, wherein the source rail is a source voltage rail or a source ground rail, wherein the first and second passive loads have the same impedance; and a bias voltage source electrically coupled to the gates of the first and second transistors, wherein a voltage of the bias voltage source is a fixed predetermined voltage below a voltage of the source voltage rail or above a voltage of the source ground rail.

Embodiments of the receiver may include one or more of the following features. Some embodiments comprise a first bias resistor electrically coupled to the first input of the receiver, wherein the first bias resistor and the bias voltage source are electrically coupled in series between the first input of the receiver and the gates of the first and second transistors; and a second bias resistor electrically coupled to the second input of the receiver, wherein the second bias resistor and the bias voltage source are electrically coupled in series between the second input of the receiver and the gates of the first and second transistors.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

Figure 1A:
FIGS. 1A,B,C,D illustrate four examples of passive impedance loads that present a real impedance equivalent to a resistive load at the frequencies of interest.

The figures are not exhaustive and do not limit the present disclosure to the precise form disclosed.

DETAILED DESCRIPTION

In recent years silicon based isolators that use a transmitter device and a receiver device on two separate galvanically isolated silicon chips have become popular. One of the key requirements of these solutions is to be able to tolerate large DC and transient voltage differences between the transmitter and receiver chips. In particular, even if there's a large common mode voltage change between the two chips (transmitter and receiver) of the order of 100 KV/us, no signal corruption should happen. This is a key metric for digital isolators called "common mode transient immunity" (CMTI).

One common realization of the galvanic isolation is by using high voltage capacitors in series between transmitter and receiver devices. Such capacitors are most commonly implemented in either or both of the transmitter and receiver silicon devices. The capacitors block DC voltages but a common mode transient event produces a current through the capacitors.

For a CMTI event of dV/dt present for a duration T, a CMTI current that flows through these capacitors is given by I=C*dV/dt, where C is the equivalent series capacitance between transmitter and receiver nodes of the silicon isolator for the entire duration of the CMTI event T. For a typical implementation with an isolation capacitor value of 100 fF and CMTI rating of 100 KV/us lasting for 1 us, a current of 10 mA will flow through each capacitor for 1 us.

This current will flow from transmitter to receiver or in the opposite direction depending on the polarity of the CMTI pulse. The circuits used to generate the transmit signal and amplify the received signal across the galvanic barrier must work correctly in the presence of such large common mode currents.

Current industry implementations test the digital isolator parts by applying a scaled down version of the CMTI pulse for a shorter duration while keeping the dV/dt of the CMTI event the same as in the specification. For example, a part rated at 100 KV/us CMTI is often tested with a 1000V/10 ns pulse which lasts for 10 ns. The part is declared to have passed if the logic state at the receiver output does not switch states during the duration of the CMTI event of (in this case) 10 ns. This however does not truly test the effect of common mode transient stress on the digital isolator part and falsely gives the impression of satisfying CMTI specifications without truly doing so.

Typical silicon implementations of transmitter and receiver circuits take time to respond to the fast common mode transient. If the transmitter to receiver signal path is only monitored for a short period of time (10 ns to 100 ns), the effects of the common mode transient are not visible. The common mode transient signal affects the common mode of the transmitter and receiver circuit which can typically take microseconds to respond. This can create errors far in time from the CMTI event itself as the circuits under stress finally respond to the common mode transient event and go into undesired states before recovering. To truly test the CMTI specification of a digital isolator, the receiver output must be monitored for a long enough duration to make sure the receiver output does not switch states away from the CMTI event itself of ~10 ns.

Some silicon implementations try to detect the common mode event at the receiver and cancel the common mode current transient using additional circuits to prevent such misbehavior. However, active circuits are not fast enough without using very high power consumption to respond to such transient events in a timely manner and prevent corruption of the signal of interest due to common mode transients completely. This limits the maximum data transfer rate across the isolation barrier possible with such implementations.

Embodiments of the disclosed technologies may employ a common mode biasing technique in the isolation device transmitter and/or receiver circuits that can tolerate these large common mode transient currents for arbitrarily long durations without any degradation in performance. This technique does not rely on the use of active circuits to detect and cancel such events. With no active circuits used in the implementation, the digital isolator device maximum data transfer rate is not limited by the response time of the active circuits to common mode transients.

Figure 1B:
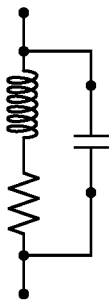
Figure 1C:
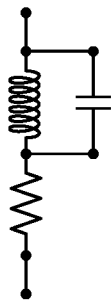
Figure 1D:
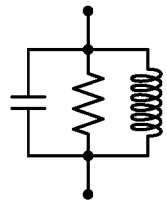

The digital isolator transmitter driver stage may include a differential amplifier realized using active devices and passive impedance loads that present a real impedance equivalent to a resistive load at the frequencies of interest. Such a load may be a pure resistor equal to Rload or may include a combination of resistive, inductive and capacitive elements organized in such a way as to present a real impedance equivalent to Rload at the frequencies of interest. FIGS. 1A-D illustrate four examples of such loads. In the example of FIG. 1A, the load is a resistor. In the example of FIG. 1B, the load includes an inductor and a resistor electrically coupled in series, and a capacitor electrically coupled in parallel with the inductor and the resistor. In the example of FIG. 1C, the load includes an inductor and a resistor electrically coupled in series, and a capacitor electrically coupled in parallel with the inductor. In the example of FIG. 1D, the load includes an inductor, a resistor, and a capacitor, all electrically coupled in parallel. Of course, other similar loads may be used instead.

Figure 2:
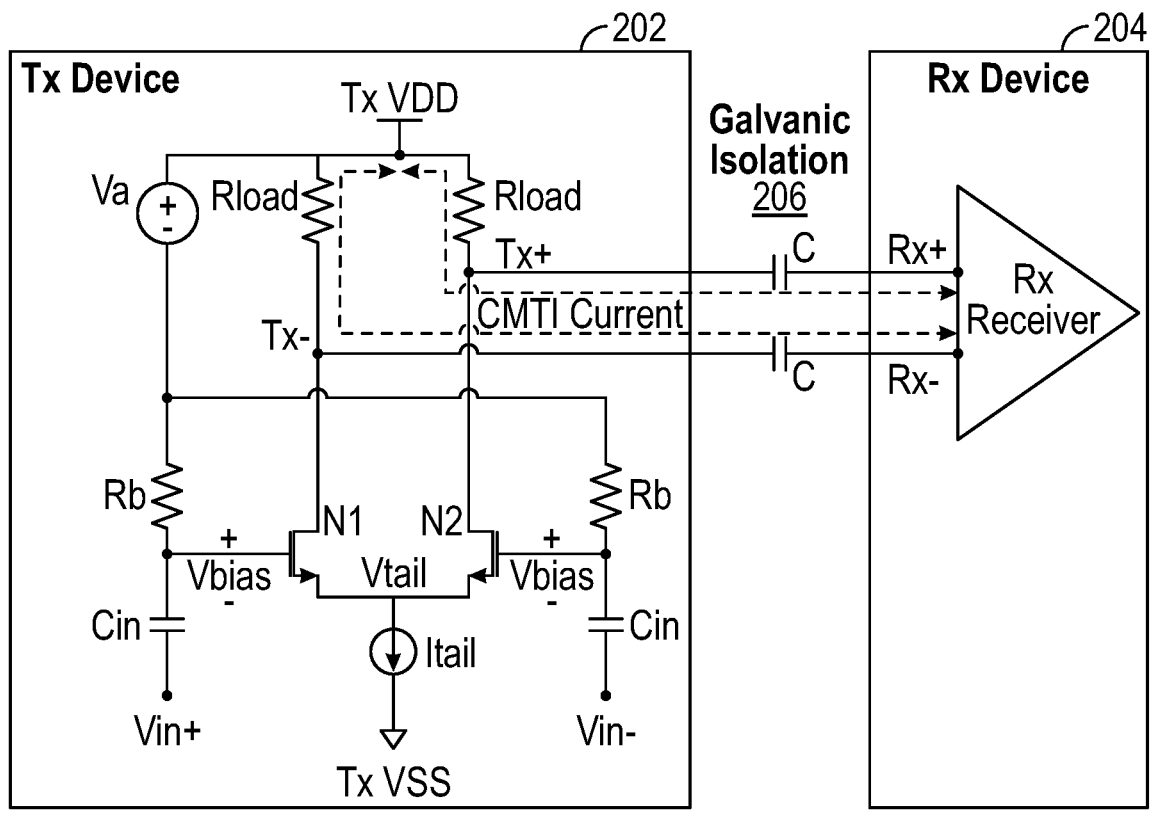
FIG. 2 is a circuit diagram of a transmitter output driver that includes a differential amplifier realized using common source NMOS devices according to some embodiments of the disclosed technologies.

FIG. 2 is a circuit diagram of a transmitter driver that includes a differential amplifier realized using common source NMOS devices according to some embodiments of the disclosed technologies. Referring to FIG. 2, the transmitter output driver (Tx Device) 202 drives a receiver (Rx Device) 204 via a galvanic isolation barrier 206. The galvanic isolation barrier 206 may include two capacitors C. The transmitter driver 202 includes a differential amplifier that includes a first transistor N1 electrically coupled between a first input Vin+ of the transmitter 202 and a first output Tx− of the transmitter 202 and a second transistor N2 electrically coupled between a second input Vin− of the transmitter 202 and a second output Tx+ of the transmitter 202. The sources of transistors N1 and N2 are electrically coupled together.

The differential amplifier also includes a first passive load Rload electrically coupled between the first output Tx− of the transmitter 202 and a source voltage rail Tx VDD, and a second passive load Rload electrically coupled between the second output Tx+ of the transmitter 202 and the source voltage rail. The first and second passive loads may have the same impedance. A bias current source Itail may be electrically coupled between the sources of transistors N1, N2, and the source ground rail Tx VSS. The current sources described herein may be actual current sources from a current mirror, for example. The type may be NMOS for NMOS transistor configurations, and PMOS for PMOS transistor configurations.

A bias voltage source Va may be configured to bias the gate of transistor N1 and the gate of transistor N2. In the example of FIG. 2, the bias voltage source Va may be electrically coupled between the common gates of transistors N1,N2 and the source voltage rail Tx VDD. The voltage of the bias voltage source Va may be a fixed predetermined voltage below the voltage of the source voltage rail.

A first bias resistor Rb may be electrically coupled between the gate of transistor N1 and the bias voltage source Va. A second bias resistor Rb may be electrically coupled between the gate of transistor N2 and the bias voltage source Va. Input capacitors Cin may be added at the inputs of the transmitter driver.

The differential amplifier input common mode may be biased at a voltage Va below the supply voltage Tx VDD. Then the common mode voltage at the common source node of the differential pair Vtail is at a voltage equal to Va+Vbias below the transmitter supply voltage Tx VDD. During a common mode transient event the CMTI Current (shown as a broken line) in each leg of the galvanic isolation capacitor flows through the equivalent load resistor Rload of each half of the differential amplifier stage.

Figure 10:
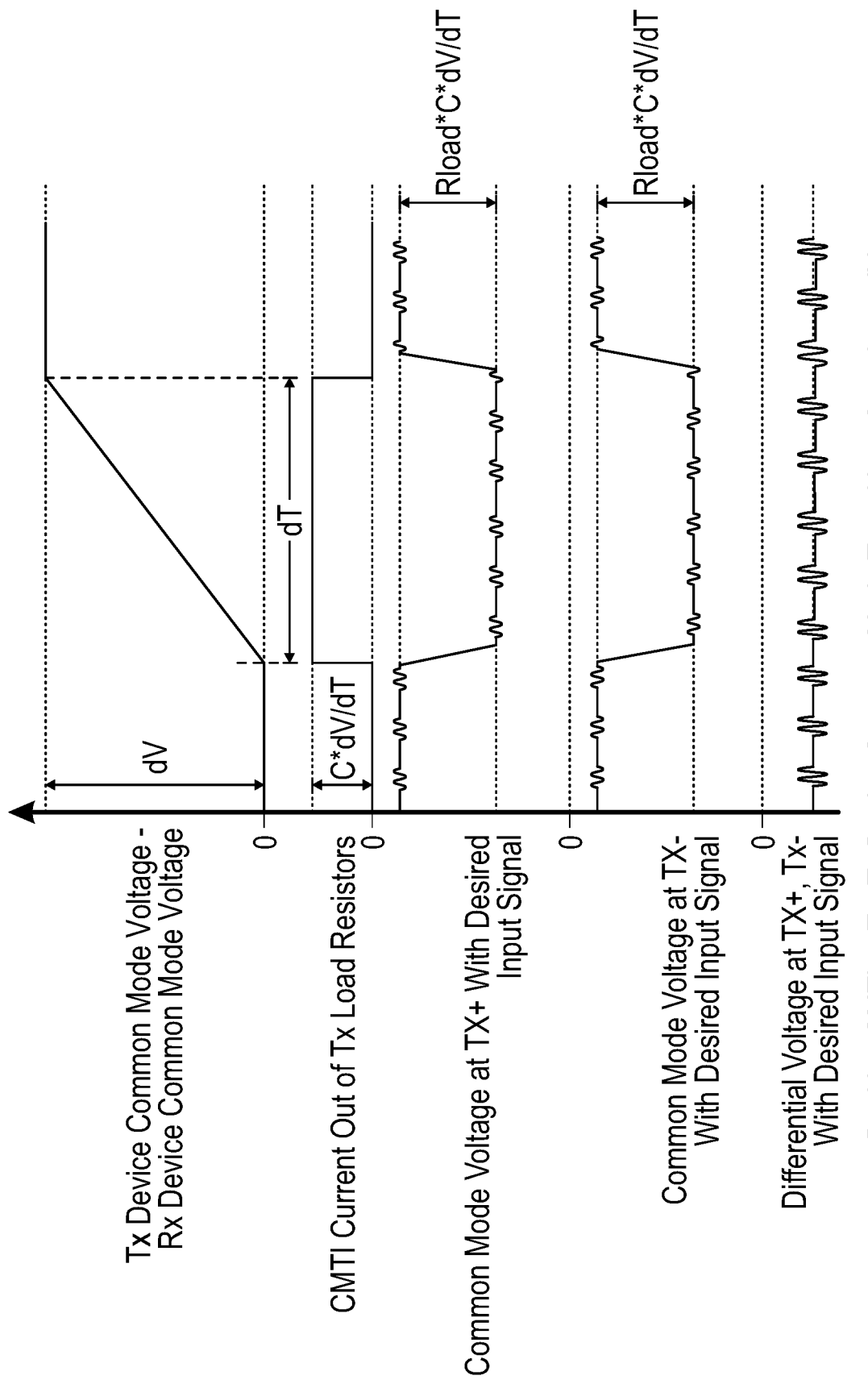
FIG. 10 illustrates common mode transitions for the circuit of FIG. 2 during a positive CMTI event.

FIG. 10 illustrates common mode transitions for the circuit of FIG. 2 during a positive CMTI event. Referring to FIG. 10, during a positive CMTI event at the transmitter 202, the transmitter common mode voltage goes higher than the receiver common mode voltage by dV during transition time dT. The common mode current I=C*dv/dt flows from the transmitter 202 into the receiver 204 through the galvanic isolation capacitors C. The common mode voltage at the drain nodes Tx+, Tx− of the common source differential amplifier drops by I*Rload due to this common mode current. The values for Rload, differential amplifier bias current (Itail, and Va are chosen in such a way that even during the worst case common mode event, i.e. the maximum value of I=C*dV/dt, the drain to source voltage at either of the transmitter differential pair transistors N1,N2 is never lower than the respective device saturation voltage. The differential amplifier continues to amplify the signal of interest during the entire common mode transient event without any degradation.

Figure 11:
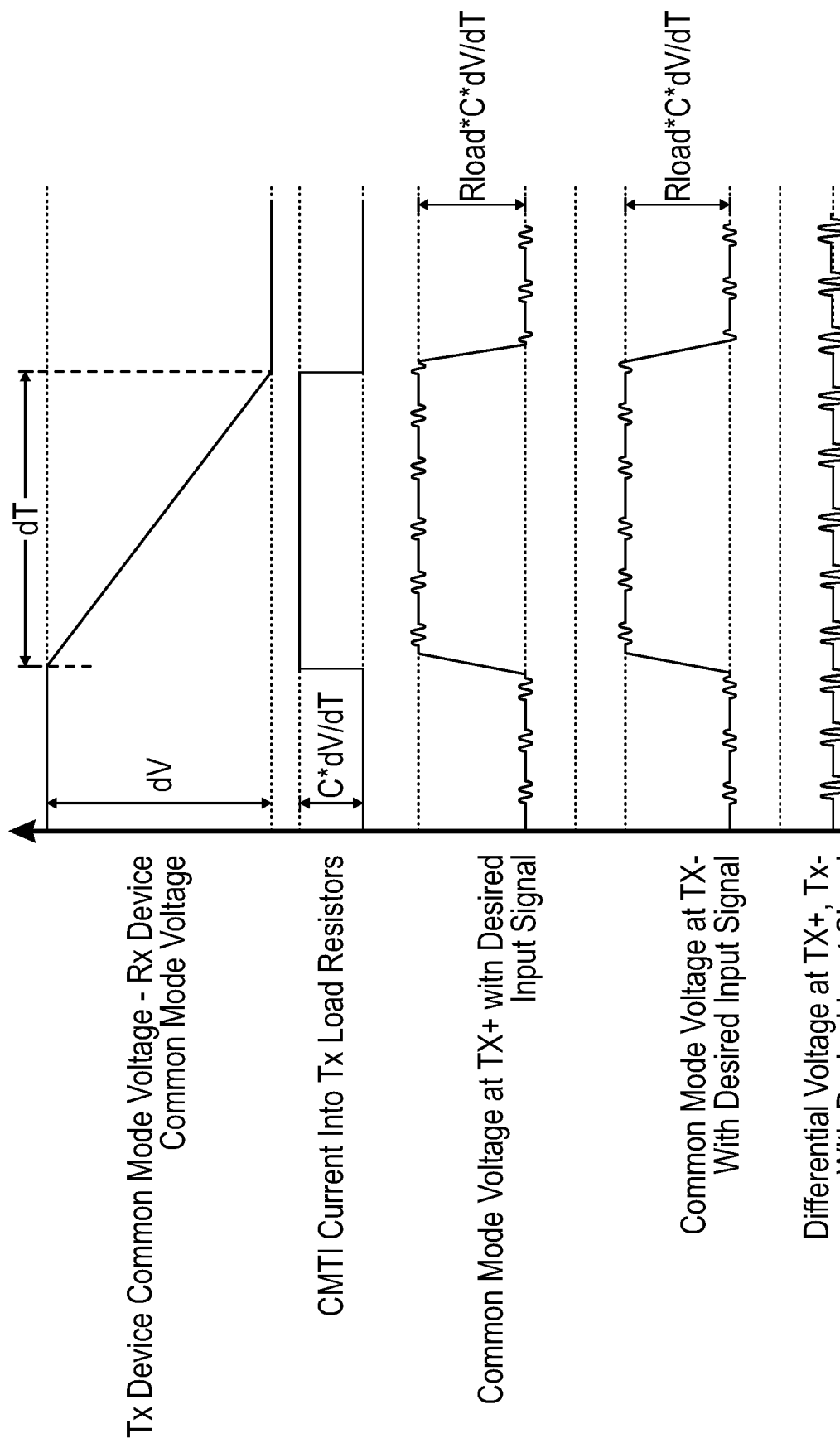
FIG. 11 illustrates common mode transitions for the circuit of FIG. 2 during a negative CMTI event.

FIG. 11 illustrates common mode transitions for the circuit of FIG. 2 during a negative CMTI event. Referring to FIG. 11, during a negative CMTI event at the transmitter 202, the transmitter common mode voltage goes lower than the receiver common mode voltage. The common mode current flows from the receiver 204 into the transmitter 202 through the galvanic isolation capacitors C. The common mode voltage at the drain nodes Tx+, Tx− of the transmitter common source differential amplifier increases by I*Rload. This common mode voltage can go higher than the supply voltage. However, as long as the breakdown voltage of the transmitter differential pair devices N1,N2 are not exceeded, the transmitter differential pair continues to amplify the signal of interest for the entire duration of the common mode transient event without any degradation.

The transmitter driver may also be implemented as a common gate differential amplifier using appropriate devices. One example of such an implementation uses NMOS devices with load resistors at the drain terminal and input signal at the source terminal. The implementation of the transmitter driver may also be done using PMOS devices or equivalent active devices with load resistors going to the transmitter ground instead of supply. In general any active amplifying device may be used to realize the differential transmitter driver as long as the load impedance is designed in a way to present an equivalent resistive load of value Rload such that during the CMTI event the additional drop across this Rload of Rload*C*dV/dt does not put the active amplifying devices in an undesired region of operation.

Figure 3:
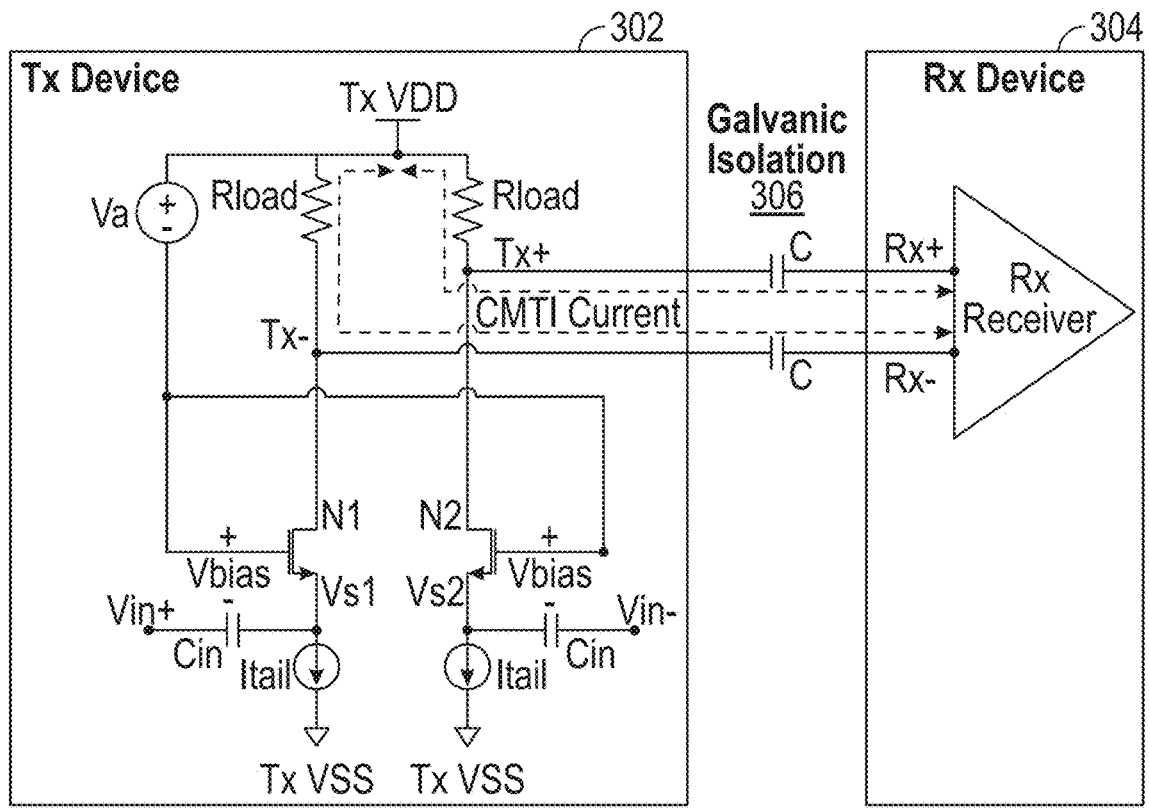
FIG. 3 is a circuit diagram of a transmitter output driver that includes a differential amplifier realized using common gate NMOS devices according to some embodiments of the disclosed technologies.

FIG. 3 is a circuit diagram of a transmitter output driver that includes a differential amplifier realized using common gate NMOS devices according to some embodiments of the disclosed technologies. Referring to FIG. 3, the transmitter driver (Tx Device) 302 drives a receiver (Rx Device) 304 via a galvanic isolation barrier 306. The galvanic isolation barrier 306 may include two capacitors C. The transmitter driver 302 includes a differential amplifier that includes a first transistor N1 electrically coupled between a first input Vin+ of the transmitter 302 and a first output Tx− of the transmitter 302 and a second transistor N2 electrically coupled between a second input Vin− of the transmitter 302 and a second output Tx+ of the transmitter 302. The gates of transistors N1 and N2 are electrically coupled together.

The differential amplifier also includes a first passive load Rload electrically coupled between the first output Tx− of the transmitter 302 and a source voltage rail Tx VDD, and a second passive load Rload electrically coupled between the second output Tx+ of the transmitter 302 and the source voltage rail. The first and second passive loads may have the same impedance. A bias current source Itail may be electrically coupled between the source of each transistor N1 and N2 and the source ground rail Tx VSS.

A bias voltage source Va may be configured to bias the gate of transistor N1 and the gate of transistor N2. In the example of FIG. 3, the bias voltage source Va may be electrically coupled between the common gates of transistors N1,N2 and the source voltage rail. The voltage of the bias voltage source Va may be a fixed predetermined voltage below the voltage of the source voltage rail Tx VDD. Input capacitors Cin may be added at the inputs of the transmitter driver.

Figure 4:
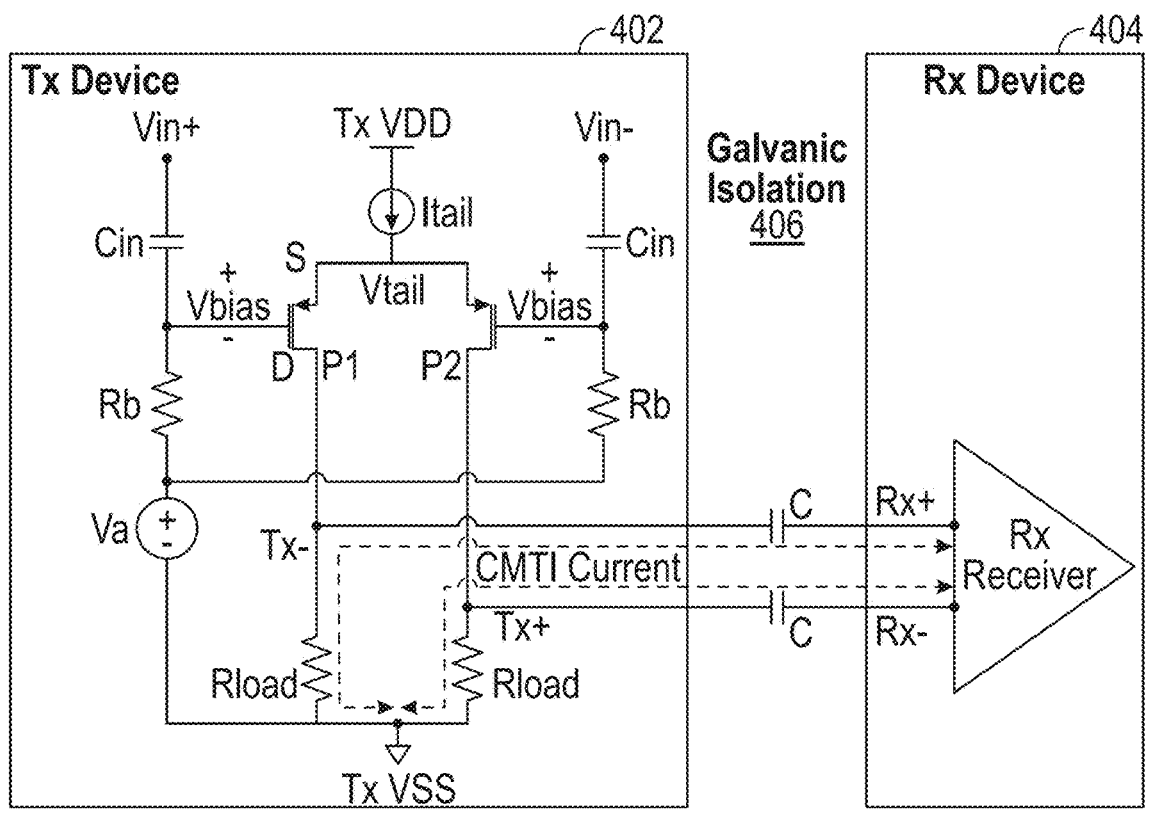
FIG. 4 is a circuit diagram of a transmitter output driver that includes a differential amplifier realized using common source PMOS devices according to some embodiments of the disclosed technologies.

FIG. 4 is a circuit diagram of a transmitter output driver that includes a differential amplifier realized using common source PMOS devices according to some embodiments of the disclosed technologies. Referring to FIG. 4, the transmitter driver (Tx Device) 402 drives a receiver (Rx Device) 404 via a galvanic isolation barrier 406. The galvanic isolation barrier 406 may include two capacitors C. The transmitter driver 402 includes a differential amplifier that includes a first transistor P1 electrically coupled between a first input Vin+ of the transmitter and a first output Tx− of the transmitter 402 and a second transistor P2 electrically coupled between a second input Vin− of the transmitter 402 and a second output Tx+ of the transmitter. The sources of transistors P1 and P2 are electrically coupled together.

The differential amplifier also includes a first passive load Rload electrically coupled between the first output Tx− of the transmitter and a source ground rail Tx VSS, and a second passive load Rload electrically coupled between the second output Tx+ of the transmitter and the source ground rail. The first and second passive loads may have the same impedance. A bias current source Itail may be electrically coupled between the common sources of transistors P1 and P2 and the source voltage rail Tx VDD.

A bias voltage source Va may be configured to bias the gate of transistor P1 and the gate of transistor P2. In the example of FIG. 4, a first bias resistor Rb may be electrically coupled between the gate of transistor P1 and the bias voltage source Va. A second bias resistor Rb may be electrically coupled between the gate of transistor P2 and the bias voltage source Va. The voltage of the bias voltage source Va may be a fixed predetermined voltage above the voltage of the source ground rail Tx VSS. Input capacitors Cin may be added at the inputs of the transmitter driver.

Figure 5:
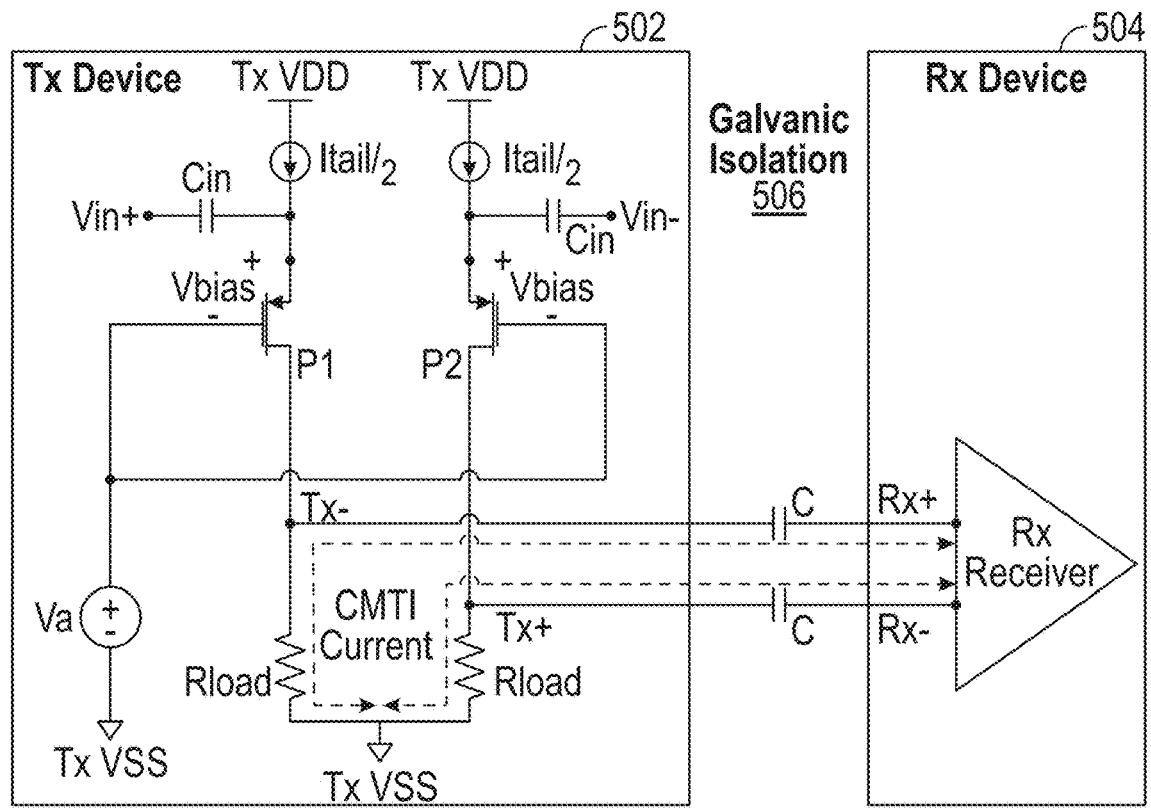
FIG. 5 is a circuit diagram of a transmitter output driver that includes a differential amplifier realized using common gate PMOS devices according to some embodiments of the disclosed technologies.

FIG. 5 is a circuit diagram of a transmitter output driver that includes a differential amplifier realized using common gate PMOS devices according to some embodiments of the disclosed technologies. Referring to FIG. 5, the transmitter driver (Tx Device) 502 drives a receiver (Rx Device) 504 via a galvanic isolation barrier 506. The galvanic isolation barrier 506 may include two capacitors C. The transmitter driver 502 includes a differential amplifier that includes a first transistor P1 electrically coupled between a first input Vin+ of the transmitter and a first output Tx− of the transmitter 502 and a second transistor P2 electrically coupled between a second input Vin− of the transmitter 502 and a second output Tx+ of the transmitter. The gates of transistors P1 and P2 are electrically coupled together.

The differential amplifier also includes a first passive load Rload electrically coupled between the first output Tx− of the transmitter and a source ground rail Tx VSS, and a second passive load Rload electrically coupled between the second output Tx+ of the transmitter and the source ground rail. The first and second passive loads may have the same impedance. A bias current source Itail/2 may be electrically coupled between the source of each transistor P1 and P2 and the source voltage rail Tx VDD.

A bias voltage source Va may be configured to bias the gate of transistor P1 and the gate of transistor P2. In the example of FIG. 5, the bias voltage source Va may be electrically coupled between the common gates of transistors P1,P2 and the source ground rail.

Similar to the transmitter output circuit, the receiver input circuit on the receiver side of the galvanic isolator may also be designed in a way to tolerate large common mode transient currents. One approach is to have the galvanic isolation capacitor device connect to equivalent load impedance Rload at the receiver side connected to the receiver ground Rx VDD. Some embodiments provide an appropriate common source or common gate amplifier with proper biasing in a manner similar to that described above so as not to effect processing of the differential signal of interest in the presence of large common mode currents induced by common mode transient events. In general any amplifying device may be used as long as the voltage change across the load resistor due to a common mode transient event does not drive the amplifying device into an undesired region of operation.

Figure 6:
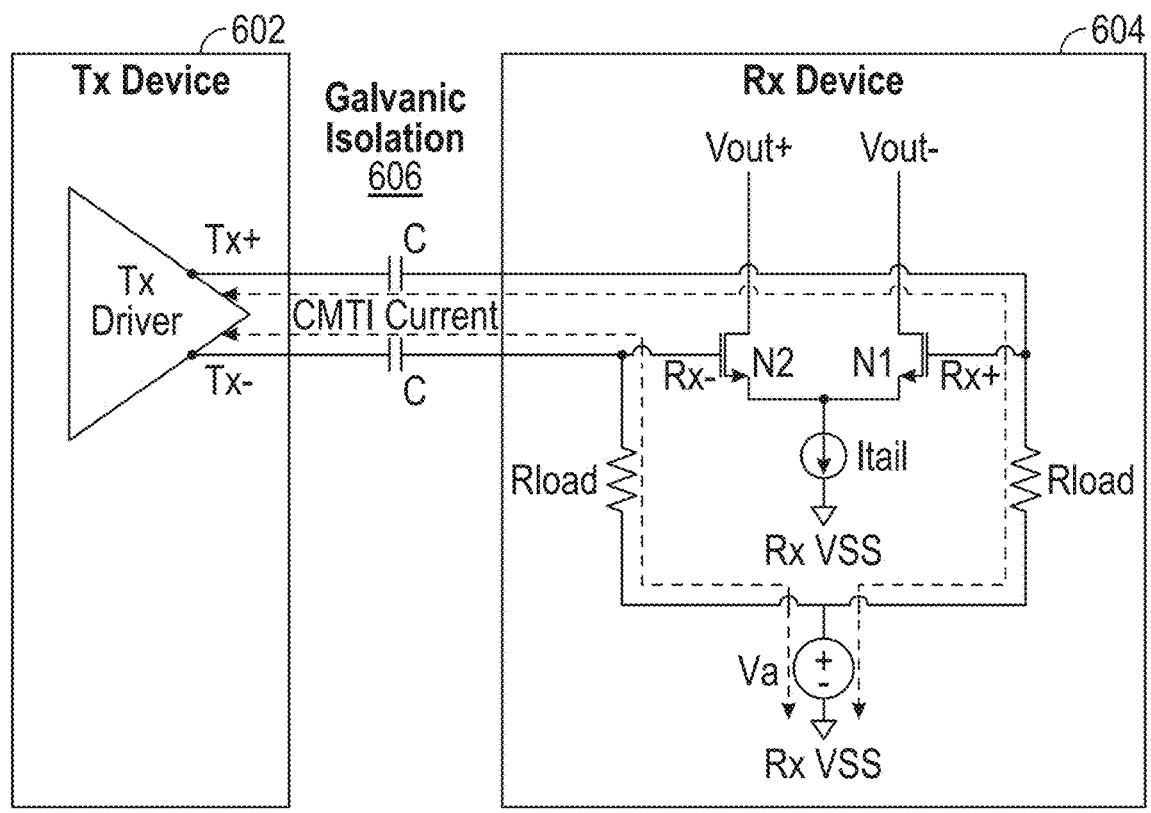
FIG. 6 is a circuit diagram of a receiver that includes an input differential amplifier realized using common source NMOS devices according to some embodiments of the disclosed technologies.

FIG. 6 is a circuit diagram of a receiver that includes an input differential amplifier realized using common source NMOS devices according to some embodiments of the disclosed technologies. Referring to FIG. 6, a transmitter driver (Tx Device) 602 drives the receiver (Rx Device) 604 via a galvanic isolation barrier 606. The galvanic isolation barrier 606 may include two capacitors C. The receiver 604 includes a differential amplifier that includes a first transistor N1 electrically coupled between a first input Rx+ of the receiver 604 and a first output Vout− of the receiver 604 and a second transistor N2 electrically coupled between a second input Rx− of the receiver 604 and a second output Vout+ of the receiver 604. The sources of transistors N1 and N2 are electrically coupled together.

A bias current source (tail may be electrically coupled between the common sources of transistors N1, N2 and the source ground rail Rx VSS. The differential amplifier may also include a first passive load Rload electrically coupled to the first input Rx+ of the receiver 604 and a second passive load Rload electrically coupled to the second input Rx− of the receiver 604. The first and second passive loads may have the same impedance.

A bias voltage source Va may be configured to bias the gate of transistor N1 and the gate of transistor N2. In the example of FIG. 6, the bias voltage source Va may be electrically coupled between the passive loads Rload and the source ground rail Rx VSS. The voltage of the bias voltage source Va may be a fixed predetermined voltage above the voltage of the source ground rail Tx VDD.

Figure 7:
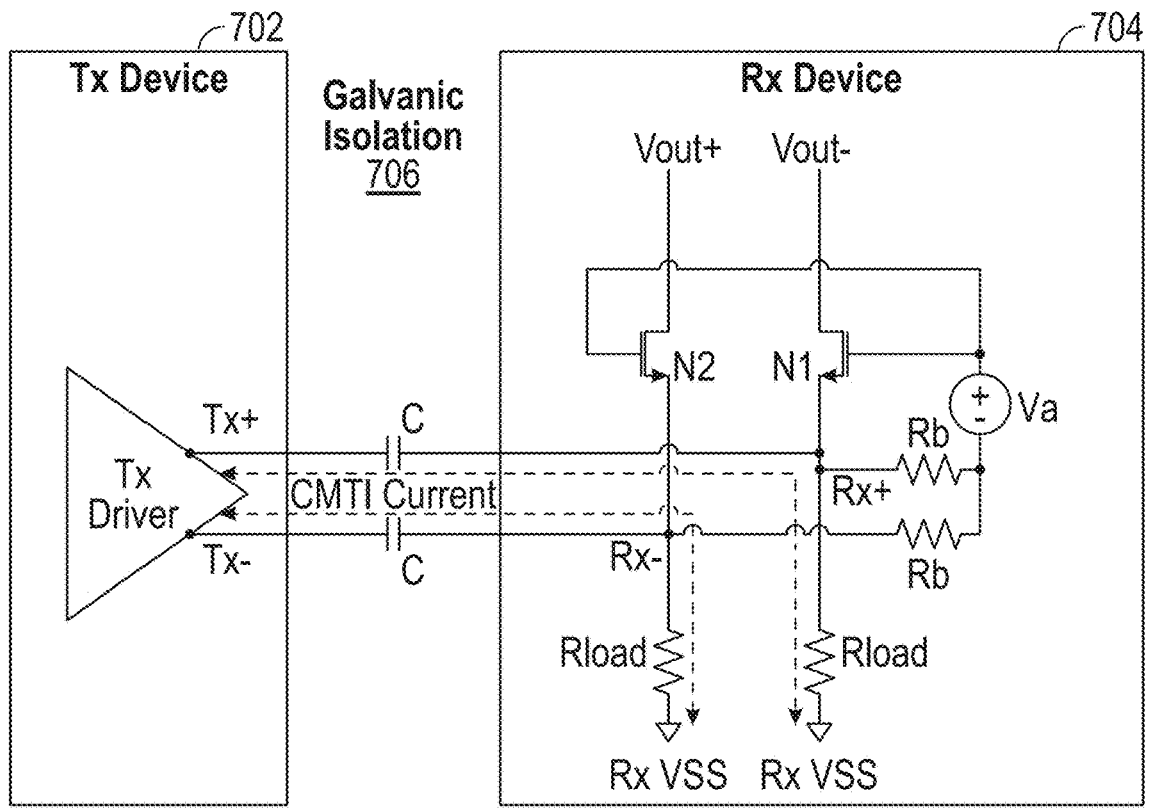
FIG. 7 is a circuit diagram of a receiver that includes an input differential amplifier realized using common gate NMOS devices according to some embodiments of the disclosed technologies.

FIG. 7 is a circuit diagram of a receiver that includes an input differential amplifier realized using common gate NMOS devices according to some embodiments of the disclosed technologies. Referring to FIG. 7, a transmitter driver (Tx Device) 702 drives the receiver (Rx Device) 704 via a galvanic isolation barrier 706. The galvanic isolation barrier 706 may include two capacitors C. The receiver 704 includes a differential amplifier that includes a first transistor N1 electrically coupled between a first input Rx+ of the receiver 704 and a first output Vout− of the receiver 704 and a second transistor N2 electrically coupled between a second input Rx− of the receiver 704 and a second output Vout+ of the receiver 704. The gates of transistors N1 and N2 are electrically coupled together.

The differential amplifier may also include a first passive load Rload electrically coupled to the first input Rx+ of the receiver 704 and a second passive load Rload electrically coupled to the second input Rx− of the receiver 704. The first and second passive loads may have the same impedance.

A bias voltage source Va may be configured to bias the gate of transistor N1 and the gate of transistor N2. In the example of FIG. 7, a first bias resistor Rb may be electrically coupled in series with the bias voltage source Va between the common gates of transistors N1 and N2 and the first input Rx+. A second bias resistor Rb may be electrically coupled in series with the bias voltage source Va between the common gates of transistors N1 and N2 and the second input Rx−. The voltage of the bias voltage source Va may be a fixed predetermined voltage below the voltage of the source voltage rail or above the voltage of the source ground rail Rx VSS.

Figure 8:
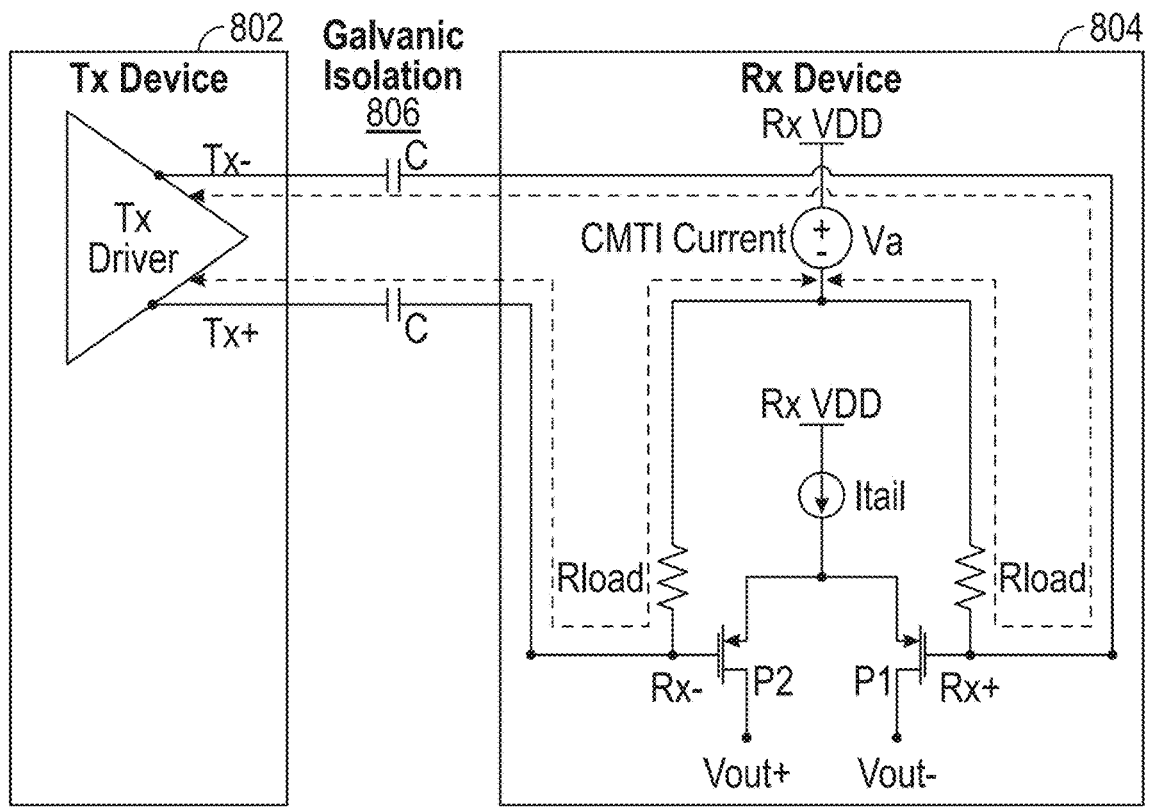
FIG. 8 is a circuit diagram of a receiver that includes an input differential amplifier realized using common source PMOS devices according to some embodiments of the disclosed technologies.

FIG. 8 is a circuit diagram of a receiver that includes an input differential amplifier realized using common source PMOS devices according to some embodiments of the disclosed technologies. Referring to FIG. 8, a transmitter driver (Tx Device) 802 drives the receiver (Rx Device) 804 via a galvanic isolation barrier 806. The galvanic isolation barrier 806 may include two capacitors C. The receiver 804 includes a differential amplifier that includes a first transistor P1 electrically coupled between a first input Rx+ of the receiver 804 and a first output Vout− of the receiver 804 and a second transistor P2 electrically coupled between a second input Rx− of the receiver 804 and a second output Vout+ of the receiver 804. The sources of transistors P1 and P2 are electrically coupled together.

The differential amplifier may also include a first passive load Rload electrically coupled to the first input Rx+ of the receiver 804 and a second passive load Rload electrically coupled to the second input Rx− of the receiver 804. The first and second passive loads may have the same impedance. A bias current source (tail may be electrically coupled between the common sources of transistors P1 and P2 and the source voltage rail Rx VDD.

A bias voltage source Va may be configured to bias the gate of transistor P1 and the gate of transistor P2. In the example of FIG. 8, the bias voltage source Va may be electrically coupled between the passive loads Rload and the source voltage rail Rx VDD.

Figure 9:
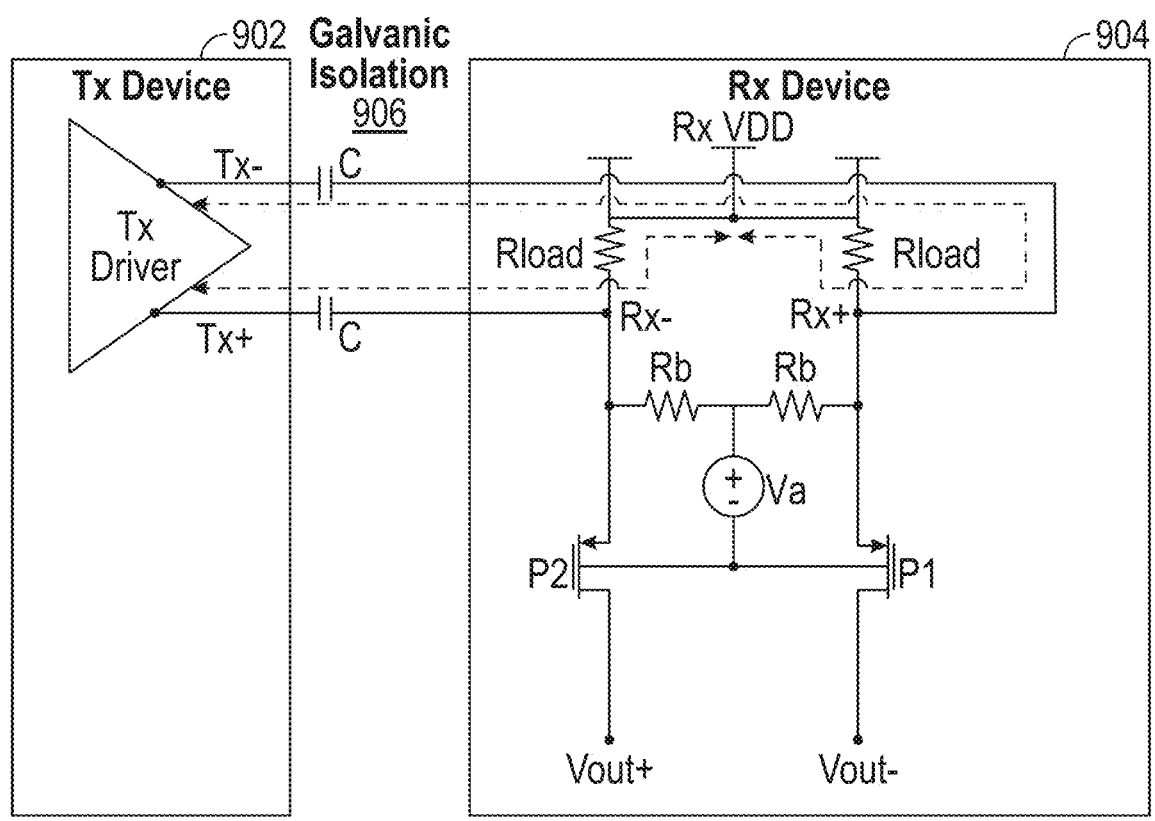
FIG. 9 is a circuit diagram of a receiver that includes an input differential amplifier realized using common gate PMOS devices according to some embodiments of the disclosed technologies.

FIG. 9 is a circuit diagram of a receiver that includes a differential amplifier realized using common gate PMOS devices according to some embodiments of the disclosed technologies. Referring to FIG. 9, a transmitter driver (Tx Device) 902 drives the receiver (Rx Device) 904 via a galvanic isolation barrier 906. The galvanic isolation barrier 906 may include two capacitors C. The receiver 904 includes a differential amplifier that includes a first transistor P1 electrically coupled between a first input Rx+ of the receiver 904 and a first output Vout− of the receiver 904 and a second transistor P2 electrically coupled between a second input Rx− of the receiver 904 and a second output Vout+ of the receiver 904. The gates of transistors P1 and P2 are electrically coupled together.

The differential amplifier may also include a first passive load Rload electrically coupled between the first input Rx+ of the receiver 904 and the source voltage rail Rx VDD and a second passive load Rload electrically coupled between the second input Rx− of the receiver 904 and the source voltage rail Rx VDD. The first and second passive loads may have the same impedance.

A bias voltage source Va may be configured to bias the gate of transistor P1 and the gate of transistor P2. In the example of FIG. 9, the receiver 904 may include a first bias resistor Rb electrically coupled to the first input Rx+ and a second bias resistor Rb electrically coupled to the second input Rx−. The bias voltage source Va may be electrically coupled between the common gates of the transistors P1,P2 and the bias resistors Rb.

It should be understood that any combination of above CMTI tolerant design approaches can be used in actual silicon realization of the digital isolator based on the application requirements, including transmitter only, receiver only, or receiver+transmitter. Each of the capacitors providing galvanic isolation between transmitter and receiver device may consist of one or more capacitive devices in series presenting an equivalent isolation capacitance C between transmitter and receiver device.

The lack of any feedback loops and utilization of passive devices, i.e. equivalent resistive loads to absorb the common mode transients, makes this approach amenable to designing digital isolators with very high common mode transient immunity. The common mode transient tolerance is—only limited by the device breakdown voltage and bias current available for the design.

The equivalent load resistors can be scaled as needed to realize the proper gain at the frequency of interest without driving the amplifying devices that comprise the transmitter and receiver amplifiers into an undesirable bias condition during common mode transients. Further, the common mode and differential impedance presented by the load Rload can be designed to be different at the frequencies of interest to further improve common mode transient immunity. Any such implementation may benefit from proven design techniques used to improve common mode rejection such as using cascode structures to realize the differential transmitter and/or receiver amplifier structure.

Figure 12:
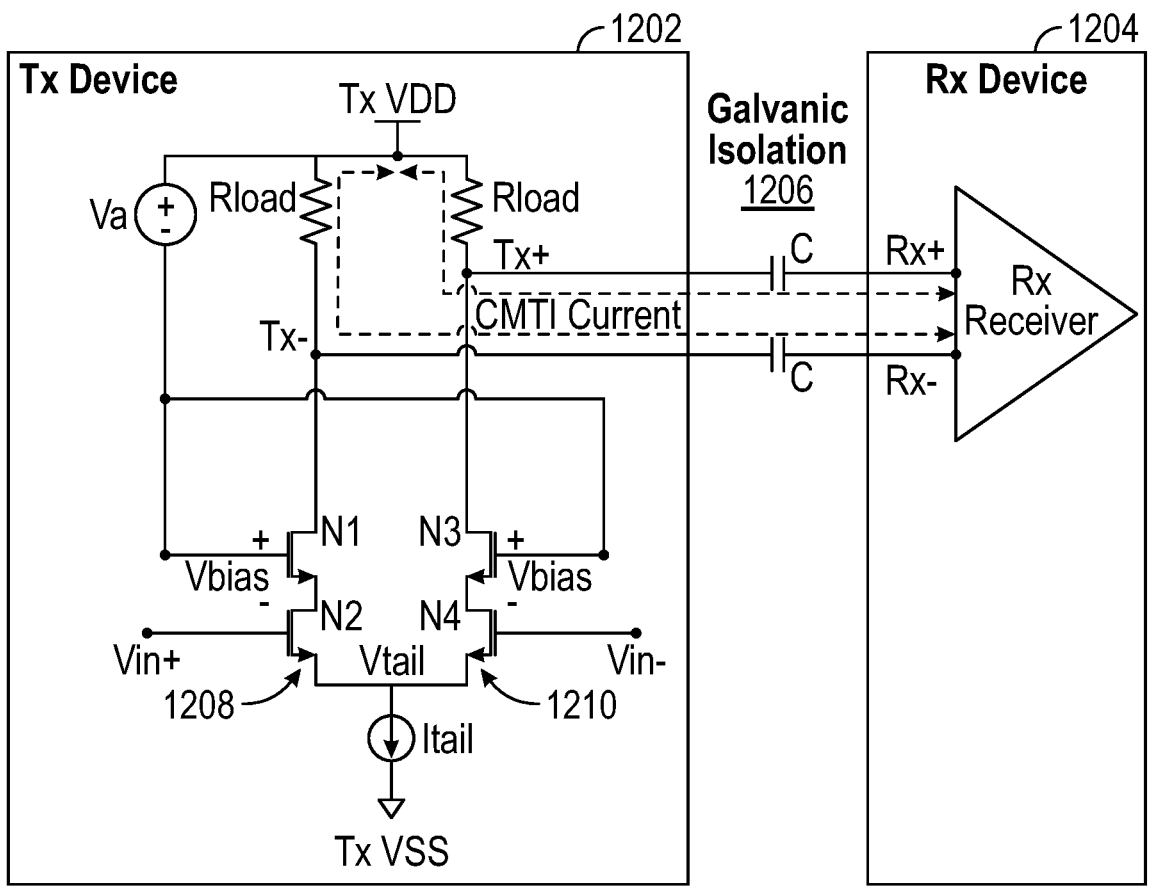
FIG. 12 is a circuit diagram of a transmitter output driver that includes a differential amplifier realized using common source NMOS devices in a cascode configuration according to some embodiments of the disclosed technologies.

FIG. 12 is a circuit diagram of a transmitter output driver that includes a differential amplifier realized using common-source NMOS devices in a cascode configuration according to some embodiments of the disclosed technologies. Referring to FIG. 12, the transmitter driver (Tx Device) 1202 drives a receiver (Rx Device) 1204 via a galvanic isolation barrier 1206. The galvanic isolation barrier 1206 may include two capacitors C. The transmitter driver 1202 includes a differential amplifier that includes a first NMOS cascode structure 1208 electrically coupled between a first input Vin+ of the transmitter 1202 and a first output Tx− of the transmitter 1202 and a second NMOS cascode structure 1210 electrically coupled between a second input Vin− of the transmitter 1202 and a second output Tx+ of the transmitter 1202. The first NMOS cascode structure 1208 includes transistors N1 and N2, connected in series. The second NMOS cascode structure 1210 includes transistors N3 and N4, also connected in series. The inputs Vin+ and Vin− of the transmitter 1202 are electrically coupled to the gates of transistors N2 and N4, respectively. The sources of transistors N2 and N4 are electrically coupled together. The gates of transistors N1 and N3 are electrically coupled together.

The differential amplifier also includes a first passive load Rload electrically coupled between a first output Tx− of the transmitter 1202 and a source voltage rail Tx VDD, and a second passive load Rload electrically coupled between the second output Tx+ of the transmitter 1202 and the source voltage rail. The first and second passive loads may have the same impedance. A bias current source Itail may be electrically coupled between the common sources of transistors N2 and N4 and the source ground rail Tx VSS.

A bias voltage source Va may be configured to bias the gate of transistor N1 and the gate of transistor N3. In the example of FIG. 12, the bias voltage source Va may be electrically coupled between the common gates of transistors N1,N3 and the source voltage rail Tx VDD. The voltage of the bias voltage source Va may be a fixed predetermined voltage below the voltage of the source voltage rail.

The foregoing description of the present disclosure has been provided for the purposes of illustration and description. It is not intended to be exhaustive or to limit the disclosure to the precise forms disclosed. The breadth and scope of the present disclosure should not be limited by any of the above-described exemplary embodiments. Many modifications and variations will be apparent to the practitioner skilled in the art. The modifications and variations include any relevant combination of the disclosed features. The embodiments were chosen and described in order to best explain the principles of the disclosure and its practical application, thereby enabling others skilled in the art to understand the disclosure for various embodiments and with various modifications that are suited to the particular use contemplated. It is intended that the scope of the disclosure be defined by the following claims and their equivalence.

What is claimed is:

1. A transmitter, comprising:
a differential amplifier having differential outputs connected to outputs of the transmitter, the differential amplifier comprising:
a first transistor having a first terminal coupled to a first input of the transmitter and a second terminal coupled to a first output of the transmitter, wherein the first terminal of the first transistor is a gate of the first transistor, and the second terminal of the first transistor is a drain of the first transistor,
a second transistor having a first terminal coupled to a second input of the transmitter and a second terminal coupled to a second output of the transmitter, wherein the first terminal of the second transistor is a gate of the second transistor, and the second terminal of the second transistor is a drain of the second transistor,
a first passive load electrically coupled between the first output of the transmitter and a source rail, and
a second passive load electrically coupled between the second output of the transmitter and the source rail, wherein the source rail is a source voltage rail or a source ground rail, and wherein the first and second passive loads have the same impedance; and
a bias voltage source configured to bias the gate of the first transistor and the gate of the second transistor, wherein a voltage of the bias voltage source is a fixed predetermined voltage below a voltage of the source voltage rail or above a voltage of the source ground rail.

2. The transmitter of claim 1, wherein:
the first and second transistors are N-channel Metal Oxide Semiconductor (NMOS) transistors.

3. The transmitter of claim 2, wherein:
the first terminal of the first transistor is the gate of the first transistor electrically coupled to the first input of the transmitter;
the first terminal of the second transistor is the gate of the second transistor electrically coupled to the second input of the transmitter;
the source rail is the source voltage rail;
the first passive load is electrically coupled between the drain of the first transistor and the source voltage rail;
the second passive load is electrically coupled between the drain of the second transistor and the source voltage rail; and
a source of the first transistor is electrically coupled to a source of the second transistor.

4. The transmitter of claim 3, further comprising:
a current source electrically coupled between the source ground rail and the sources of the first and second transistors.

5. The transmitter of claim 3, further comprising:
a first bias resistor electrically coupled between the gate of the first transistor and the bias voltage source; and
a second bias resistor electrically coupled between the gate of the second transistor and the bias voltage source.

6. The transmitter of claim 3, wherein the first and second passive loads comprise at least one of:
a resistor;
an inductor and a resistor electrically coupled in series, and a capacitor electrically coupled in parallel with the inductor and the resistor;
an inductor and a resistor electrically coupled in series, and a capacitor electrically coupled in parallel with the inductor; or
an inductor, a resistor, and a capacitor, wherein the inductor, the resistor, and the capacitor are electrically coupled in parallel.

7. The transmitter of claim 6, further comprising:
a first bias resistor electrically coupled between the gate of the first transistor and the bias voltage source; and
a second bias resistor electrically coupled between the gate of the second transistor and the bias voltage source.

8. The transmitter of claim 2, wherein:
the first terminal of the first transistor is a source of the first transistor electrically coupled to the first input of the transmitter;
the first terminal of the second transistor is a source of the second transistor electrically coupled to the second input of the transmitter;
the source rail is the source voltage rail;
the first passive load is electrically coupled between the drain of the first transistor and the source voltage rail;
the second passive load is electrically coupled between the drain of the second transistor and the source voltage rail; and
the gate of the first transistor is electrically coupled to the gate of the second transistor.

9. The transmitter of claim 8, further comprising:
a first current source electrically coupled between the source ground rail and the source of the first transistor; and
a second current source electrically coupled between the source ground rail and the source of the second transistor.

10. The transmitter of claim 8, wherein the first and second passive loads comprise at least one of:
a resistor;
an inductor and a resistor electrically coupled in series, and a capacitor electrically coupled in parallel with the inductor and the resistor;
an inductor and a resistor electrically coupled in series, and a capacitor electrically coupled in parallel with the inductor; or
an inductor, a resistor, and a capacitor, wherein the inductor, the resistor, and the capacitor are electrically coupled in parallel.

11. The transmitter of claim 2, wherein:
the bias voltage source is connected between the source voltage rail and the gates of the first transistor and the second transistor.

12. The transmitter of claim 1, wherein the first and second passive loads comprise at least one of:
a resistor;
an inductor and a resistor electrically coupled in series, and a capacitor electrically coupled in parallel with the inductor and the resistor;
an inductor and a resistor electrically coupled in series, and a capacitor electrically coupled in parallel with the inductor; or
an inductor, a resistor, and a capacitor, wherein the inductor, the resistor, and the capacitor are electrically coupled in parallel.

13. The transmitter of claim 1, wherein:
the first and second transistors are P-channel Metal Oxide Semiconductor (PMOS) transistors.

14. The transmitter of claim 13, wherein:
the first terminal of the first transistor is the gate of the first transistor electrically coupled to the first input of the transmitter;
the first terminal of the second transistor is the gate of the second transistor electrically coupled to the second input of the transmitter;
the source rail is the source ground rail;
the first passive load is electrically coupled between the drain of the first transistor and the source ground rail;
the second passive load is electrically coupled between the drain of the second transistor and the source ground rail; and
a source of the first transistor is electrically coupled to a source of the second transistor.

15. The transmitter of claim 14, further comprising:
a current source electrically coupled between the source voltage rail and the sources of the first and second transistors.

16. The transmitter of claim 14, wherein the first and second passive loads comprise at least one of:
a resistor;
an inductor and a resistor electrically coupled in series, and a capacitor electrically coupled in parallel with the inductor and the resistor;
an inductor and a resistor electrically coupled in series, and a capacitor electrically coupled in parallel with the inductor; or
an inductor, a resistor, and a capacitor, wherein the inductor, the resistor, and the capacitor are electrically coupled in parallel.

17. The transmitter of claim 13, wherein:
the first terminal of the first transistor is a source of the first transistor electrically coupled to the first input of the transmitter;
the first terminal of the second transistor is a source of the second transistor electrically coupled to the second input of the transmitter;
the source rail is the source ground rail;
the first passive load is electrically coupled between the drain of the first transistor and the source ground rail;
the second passive load is electrically coupled between the drain of the second transistor and the source ground rail; and
the gate of the first transistor is electrically coupled to the gate of the second transistor.

18. The transmitter of claim 17, further comprising:
a first current source electrically coupled between the source voltage rail and the source of the first transistor; and
a second current source electrically coupled between the source voltage rail and the source of the second transistor.

19. The transmitter of claim 17, wherein the first and second passive loads comprise at least one of:
a resistor;
an inductor and a resistor electrically coupled in series, and a capacitor electrically coupled in parallel with the inductor and the resistor;
an inductor and a resistor electrically coupled in series, and a capacitor electrically coupled in parallel with the inductor; or
an inductor, a resistor, and a capacitor, wherein the inductor, the resistor, and the capacitor are electrically coupled in parallel.

20. The transmitter of claim 13, wherein the bias voltage source is connected between the source ground rail and the gates of the first transistor and the second transistor.

* * * * *